United States Patent [19]

Seko et al.

[11] Patent Number: 5,809,052
[45] Date of Patent: Sep. 15, 1998

[54] SEMICONDUCTOR LASER ARRAY DRIVING METHOD, SEMICONDUCTOR LASER ARRAY DRIVING DEVICE AND IMAGE FORMING APPARATUS

[75] Inventors: Yasuji Seko; Akemi Murakami; Hiromi Otoma; Nobuaki Ueki, all of Ebina; Hideki Fukunaga, Kanagawa; Hideo Nakayama; Mario Fuse, both of Ebina, all of Japan

[73] Assignee: Fuji Xerox Co., Ltd., Tokyo, Japan

[21] Appl. No.: 731,750

[22] Filed: Oct. 18, 1996

Related U.S. Application Data

[63] Continuation-in-part of Ser. No. 659,374, Jun. 6, 1996, abandoned.

[30] Foreign Application Priority Data

Jun. 6, 1995 [JP] Japan ................... 7-139474
Jun. 5, 1996 [JP] Japan ................... 8-143290

[51] Int. Cl.$^6$ ................................................. H01S 3/08
[52] U.S. Cl. ................... 372/50; 372/38; 372/34; 372/24
[58] Field of Search ....................... 372/50, 38, 34, 372/24; 355/208

[56] References Cited

U.S. PATENT DOCUMENTS 4,359,773  11/1982  Swartz et al. .
4,443,695  4/1984   Kitamura .
4,862,802  9/1989   Streifer et al. .
5,327,451  7/1994   Walker et al. ................ 372/38
5,349,597  9/1994   Mizuochi .
5,499,079  3/1996   Kinoshita et al. ............ 355/208
5,528,611  6/1996   Scheps .

FOREIGN PATENT DOCUMENTS

A-7-289569  11/1995  Japan .
A-8-8878    1/1996   Japan .

*Primary Examiner*—Rodney B. Bovernick
*Assistant Examiner*—Yisun Song
*Attorney, Agent, or Firm*—Oliff & Berridge, PLC

[57] ABSTRACT

A semiconductor laser array driving method for driving a semiconductor laser array having a plurality of light-emitting points arranged on a base member. The semiconductor laser array driving method has a step of driving the plurality of light-emitting points by a driving pulse current of a pulse width and a duty factor meeting an inequality: $\Delta T_1 / \Delta T_0 < \frac{1}{2}$, where $\Delta T_0$ is a temperature rise in active layers of the light-emitting points when the semiconductor laser array is driven in a continuous drive mode using a continuous current, and $\Delta T_1$ is a temperature rise in the active layers of the light-emitting points when the semiconductor laser array is driven in a pulse drive mode using a pulse current. In the semiconductor laser array driving method, the plurality of light-emitting points are driven by a driving pulse current having a duty factor of 0.4 or below meeting an inequality: $y < 3.1 \exp(-8.9x)$, where $x$ is a duty factor and $y$ is a pulse width ($\mu s$).

11 Claims, 16 Drawing Sheets

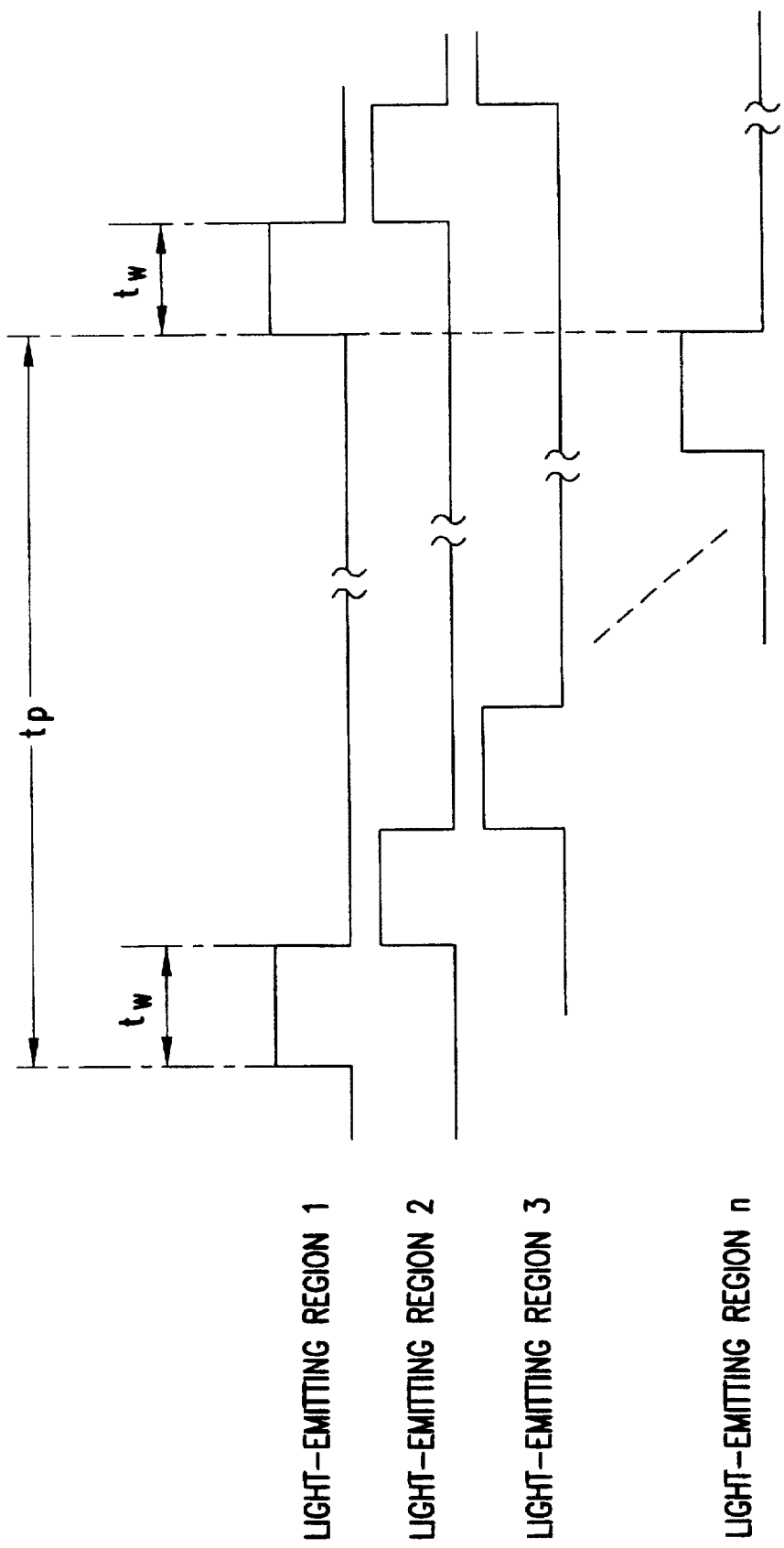

SEMICONDUCTOR LASER ARRAY DRIVING METHOD, SEMICONDUCTOR LASER ARRAY DRIVING DEVICE AND IMAGE FORMING APPARATUS

This application is a continuation-in-part of application Ser. No. 08/659,374 filed Jun. 6, 1996, now abandoned.

BACKGROUND OF THE INVENTION

1. Field of the Invention

The present invention relates to a method of driving a semiconductor laser array having a plurality of light-emitting points arranged on a base member, a semiconductor laser array driving device for carrying out the method, and an image forming apparatus to which the method is applied.

2. Description of the Related Art

Various semiconductor arrays each having a plurality of light-emitting points arranged on a base member have been proposed.

A laser beam scanner disclosed in Japanese Published Unexamined Patent Application No. Hei 1-152683 (1989) and the 48th Oyo Butsuri Gakkai, Autumn, 1987, p. 638 emits ten laser beams sequentially by light-emitting points arranged at intervals of 300 $\mu$m to move the laser beams.

An electrophotographic image forming apparatus disclosed in Japanese Published Unexamined Patent Application No. Hei 3-294875 (1991) writes an electrostatic latent image on a photoconductive drum with a semiconductor laser array disposed close to the photoconductive drum without using any condenser lens.

A color printer incorporating improvements for suppressing drooping is proposed in Japanese Published Unexamined Patent Application No. Hei 5-83503 (1993).

A multibeam laser disclosed in Japanese Published Unexamined Patent Application No. Hei 4-246878 (1992) has active regions separated by deep grooves in order to suppress drooping.

A laser array mentioned in Appl. Phys. Lett., 58, 319 (1991) is provided with 100 laser light-emitting points.

A structure disclosed in Japanese Published Unexamined Patent Application No. Hei 7-289569 (1995) has thousands of surface light-emitting elements arranged in a two-dimensional array, i.e., a matrix, and connected to longitudinal and lateral electrode lines, and is capable of being driven for high-speed operation at low power consumption.

A laser printer disclosed in Japanese Published Unexamined Patent Application No. Hei 8-8878 (1996) has a two-dimensional arrangement of thousands of vertical-cavity surface-emitting lasers, and a lens system for projecting an enlarged image of the vertical-cavity surface-emitting lasers on a photoconductive drum to form an image on the photoconductive drum.

Papers including those cited references on laser arrays have been published. The cost of those known semiconductor laser arrays having a plurality of light-emitting points on a base member is high, because all the light-emitting points of those known semiconductor laser arrays must be nondefective and must have a predetermined life, the yield of such light-emitting points is very low and hence the light-emitting points are costly.

For instance, even if the probability of acceptance of one laser is as high as 99%, the yield of laser arrays each having 1000 lasers is as low as 0.004%., so that the laser arrays are very costly. Such a problem is more serious in laser arrays each having thousands of light-emitting points.

Principal causes that reduce the yield of semiconductor lasers or semiconductor laser arrays are:

(1) defects including dislocation within, in the surface and in the end surface of crystals of compound semiconductor of semiconductor lasers, (2) defects introduced into semiconductor lasers during manufacture, and (3) progressive degradation of the characteristics of semiconductor lasers due to high current density and high photon density during laser oscillation.

The degradation of the characteristics stated in (3) makes rapid progress due to the combined effect of rise in temperature of the light-emitting points of the laser caused by current and light during laser oscillation and defects stated in (1) and (2). Such degradation of the characteristics reduces the yield and reliability of semiconductor lasers and increases the cost of semiconductor lasers. Laser arrays having many light-emitting points become defective when even one of those light-emitting points is defective, which is a serious problem.

Actually, even the yield of semiconductor lasers having several light-emitting points is lower than that of semiconductor lasers having a single light-emitting point. Therefore semiconductor laser arrays are subject to screening tests and accelerated life tests to sort nondefective semiconductor laser arrays from defective semiconductor laser arrays. Costs and time necessary for such tests further increase the cost of products.

A plurality of semiconductor laser chips each having several light-emitting points may be arranged to form a semiconductor laser array. Since the probability of each semiconductor laser chip having several light-emitting points being nondefective is high and hence the semiconductor laser array can be fabricated at a relatively low cost. However, several tens, hundreds or thousands semiconductor laser chips each having several light-emitting points must be accurately arranged on and attached to a base member to obtain a semiconductor laser array having a large number of light-emitting points. Therefore, the semiconductor laser array fabricated by such a method is relatively costly. Since the accuracy of arrangement of the light-emitting points is dependent on the accuracy of attaching the semiconductor laser chips and hence it is difficult to arrange the light-emitting points in a high accuracy of, for instance, 5 $\mu$m or below.

SUMMARY OF THE INVENTION

Accordingly, it is an object of the present invention to solve problems in semiconductor laser arrays attributable to rise in temperature of the semiconductor laser arrays, and the short life, the low yield and the high cost of the semiconductor laser arrays by an improved method of driving a semiconductor laser array.

Another object of the present invention is to provide an image forming apparatus employing a semiconductor laser array capable of being driven by the improved driving method for extended life.

According to a first aspect of the present invention, a method of driving a semiconductor laser array having a plurality of light-emitting points arranged on a base member drives the plurality of light-emitting points by a driving pulse current of a pulse width and a duty factor meeting:

$$\Delta T_1/\Delta T_0 < \tfrac{1}{2} \qquad (1)$$

where $\Delta T_0$ is a temperature rise of active layers of the light-emitting points when the semiconductor laser array is driven in a continuous drive mode using a continuous current, and $\Delta T_1$ is a temperature rise in the active layers of the light-emitting points when the semiconductor laser array is driven in a pulse drive mode using a pulse current.

The temperature rise of the semiconductor laser array can be kept within a temperature range meeting Expression (1) when the plurality of light-emitting points are driven by a driving pulse current having a duty factor of 0.4 or below meeting y<3.1 exp(−8.9x), where x is a duty factor and y is a pulse width (μs).

According to a second aspect of the present invention, a semiconductor laser array driving device for driving a semiconductor laser array having a plurality of light-emitting points arranged on a base member drives the plurality of light-emitting points by a driving pulse current of a pulse width and a duty factor meeting:

$$\Delta T_1/\Delta T_0 < \tfrac{1}{2} \qquad (2)$$

where $\Delta T_0$ is a temperature rise of active layers of the light-emitting points when the semiconductor laser array is driven in a continuous drive mode using a continuous current, and $\Delta T_1$ is a temperature rise in the active layers of the light-emitting points when the semiconductor laser array is driven in a pulse drive mode using a pulse current. Such a mode of driving a semiconductor laser array is further effective in suppressing the deterioration of the semiconductor laser array.

The temperature rise of the semiconductor laser array can be kept within a temperature range meeting Expression (2) when the plurality of light-emitting points are driven by a driving pulse current having a duty factor of 0.1 or below meeting y<0.22exp(−6.4x), where x is a duty factor and y is a pulse width (μs).

The semiconductor laser array driving method in accordance with the present invention may drive the plurality of light-emitting points of the semiconductor laser array by a driving pulse current having a pulse width and a duty factor meeting $\Delta T_1/\Delta T_0<\tfrac{1}{2}$, and may drive the light-emitting point groups, in each of which the number of the light-emitting points is the reciprocal of the duty factor, so that the light-emitting points are driven sequentially for light emission.

According to a third aspect of the present invention, a semiconductor laser array driving device for driving a semiconductor laser array having a plurality of light-emitting points arranged on a base member comprises a signal input unit which provides a light-emitting point control signal specifying at least some light-emitting points to be driven for light emission among the plurality of light-emitting points, and a light-emitting point driving unit which drives the light-emitting points specified by the light-emitting point control signal among the plurality of light-emitting points by a driving pulse current of a pulse width and a duty factor meeting:

$$\Delta T_1/\Delta T_0 < \tfrac{1}{2}$$

where $\Delta T_0$ is a temperature rise of active layers of the light-emitting points when the semiconductor laser array is driven continuously by a continuous current, and $\Delta T_1$ is a temperature rise in the active layers of the light-emitting points when the semiconductor laser array is driven by a pulse current.

In this semiconductor laser array driving device in accordance with the present invention, the light-emitting point driving unit may comprise a driver for driving the plurality of light-emitting points, and a light emission control circuit which gives the driver a signal indicating whether or not each of the plurality of light-emitting points is to be driven for light emission by the light-emitting point control signal provided by the signal input unit, according to the state of a pulse signal meeting y<3.1 exp (−8.9x), where x is a duty factor, i.e., the ratio of a pulse width (μs) to a period at which the light-emitting points are examined sequentially and recurrently to see whether or not the light-emitting points are to be driven for light emission, and y is the pulse width (μs).

The term "sequential" signifies occurring in time sequence and does not necessarily signify occurring in spatial sequence. For instance, alternate light-emitting points may be examined.

According to a fourth aspect of the present invention, an image forming apparatus provided with a semiconductor laser array having a plurality of light-emitting points arranged on a base member and capable of carrying out image forming processes including at least a semiconductor laser array driving process comprises a light-emitting point driving unit which receives an image signal indicating whether or not at least some of the plurality of light-emitting points are to be driven for light emission and which drives the light-emitting points specified by the image signal indicating the light-emitting points to be driven for light emission by a driving pulse current of a pulse width and a duty factor meeting:

$$\Delta T_1/\Delta T_0<\tfrac{1}{2}$$

where $\Delta T_0$ is a temperature rise of active layers of the light-emitting points when the semiconductor laser array is driven continuously by a continuous current, and $\Delta T_1$ is a temperature rise in the active layers of the light-emitting points when the semiconductor laser array is driven by a pulse current.

The image forming apparatus in accordance with the present invention may be provided with a display screen for displaying an image formed by light emitted by the semiconductor laser array or may be provided with a latent image recording unit fixedly or detachably provided with a latent image recording medium for recording a latent image represented by light emitted by the semiconductor laser array.

The latent image recording unit may be such as provided with a latent image recording medium, such as a photoconductive drum capable of forming an electrostatic latent image by the so-called xerographic process or such as provided with a latent image recording medium, such as a silver salt film.

In the image forming apparatus in accordance with the present invention, the plurality of light-emitting points of the semiconductor laser array may be arranged along a scanning direction.

The low yield and the degradation of the characteristics of laser elements has close relation with the process of propagation of defects within or in the end surfaces of laser elements and defects in electrodes due to the thermal effect of current and light. Therefore, the reduction of the rate of propagation of the defects is important to suppress the degradation of the characteristics and the suppression of the thermal effect on laser elements is effective in reducing the rate of propagation of the defects. The suppression of the thermal effect on laser elements stabilizes the characteristics of laser elements, retards the time-dependent deterioration of laser elements, extends the life of laser elements and improves the yield of laser elements. That is, the suppression of the temperature rise in laser elements is essential to the materialization of a laser array having an array of more than hundreds of light-emitting points.

Generally, the temperature rise in a device is derived from the relation between heat accumulating rate derived from the difference between heat generating rate and heat radiating rate, and heat generating-and-radiating time. The temperature rise in a device can be suppressed when heat generating time is reduced and heat radiating time is extended. The temperature of a device increases when heat generating time is extended and heat radiating time is reduced. The inventors of the present invention took notice of such a physical phenomenon and made studies of methods of driving semiconductor lasers, capable of keeping semiconductor lasers at temperatures that will not promote the propagation of defects in semiconductor laser elements.

The inventors of the present invention conducted experiments using different driving pulse signals for driving semiconductor lasers and found through the minute examination of experimental data obtained through the experiments that the degradation of the characteristics of semiconductor lasers can be limited to the least extent and the life of semiconductor lasers can be extended greatly, when a plurality of light-emitting points are driven by a driving pulse signal of a pulse width and a duty factor meeting:

$$\Delta T_1/\Delta T_0 < \tfrac{1}{2} \text{ (preferably, } \Delta T_1/\Delta T_0 < \tfrac{1}{3}\text{)}$$

where $\Delta T_0$ is a temperature rise of active layers of the light-emitting points when the light-emitting points are driven continuously by a continuous current, and $\Delta T_1$ is a temperature rise in the active layers of the light-emitting points when the light-emitting points are driven by a pulse current; that is, when the light-emitting points are driven by a driving pulse signal having a duty factor of 0.4 or below and meeting $y < 3.1 \exp(-8.9x)$ (preferably, $y < 0.22 \exp(-6.4x)$), where x is a duty factor and y is a pulse width ($\mu s$).

It is known that the life of a laser element is longer when the laser element is driven by a pulse current than when the same is driven by a continuous current. It is considered that the life of a laser element is extended when the laser element is driven by a pulse current because the duration of the driving current of a pulse current is shorter than that of a continuous current. However, the inventors of the present invention found that the suppression of the temperature rise in a laser element by using a driving pulse signal of a specific waveform is more effective in extending the life of a laser element and in suppressing the time-dependent deterioration of a laser element than reducing the duration of a driving current supplied to a laser element.

There has not been any knowledge about facts such as those elucidated by the experiments, which will be described later, that the temperature rise in active layers and the degradation rate of laser elements differ depending on driving pulse signals having the same duty factor and different pulse widths. The inventors of the present invention determined quantitatively the relation between the peak temperature of active layers driven by a driving pulse signal and the deterioration of laser elements, and have found the laser element driving method using a driving pulse signal capable of extending the life of laser elements.

Since the degradation of the characteristics of laser elements can significantly be reduced and the life of the laser elements can greatly be extended when the laser elements are driven by such a laser element driving method, semiconductor laser arrays are tested only to see whether or not the semiconductor laser arrays are able to emit light and the semiconductor laser arrays need not be subjected to accelerated life tests and the like when sorting nondefective semiconductor laser arrays from defective semiconductor laser arrays. Consequently, the yield of semiconductor laser arrays is improved greatly and the cost of the same can greatly be reduced.

The semiconductor laser array driving device in accordance with the present invention for carrying out the semiconductor laser array driving method of the present invention receives a light-emitting point control signal indicating light-emitting points to be actuated and drives the light-emitting points specified by the light-emitting point control signal by a driving pulse signal so as to meet Expression (1) or (2). Thus the semiconductor laser array driving device is capable of driving a semiconductor laser array suppressing the degradation of the characteristics of the semiconductor laser array.

The image forming apparatus in accordance with the present invention provided with a semiconductor laser array uses an image signal as the light-emitting point control signal for the semiconductor laser array driving device, for actuating the light-emitting points of the semiconductor laser array in a pattern to form an image. Since the yield of the semiconductor laser array is improved and the life of the semiconductor laser array is extended, the cost of the image forming apparatus can be reduced and the reliability of the image forming apparatus can be improved.

When the plurality of light-emitting points of the semiconductor laser array of the image forming apparatus are arranged along a scanning direction, a high-speed scanning operation in the scanning direction is necessary, the light-emitting points can quickly be turned on and off by electrical means, and hence a rapid image forming operation is possible.

BRIEF DESCRIPTION OF THE DRAWINGS

The above and other objects, features and advantages of the present invention will become more apparent from the following description taken in connection with the accompanying drawings, in which:

FIG. 2 is a timing chart of assistance in explaining a semiconductor laser array driving method for driving the semiconductor laser array of FIG. 1;

DESCRIPTION OF THE PREFERRED EMBODIMENTS

Figure 1:
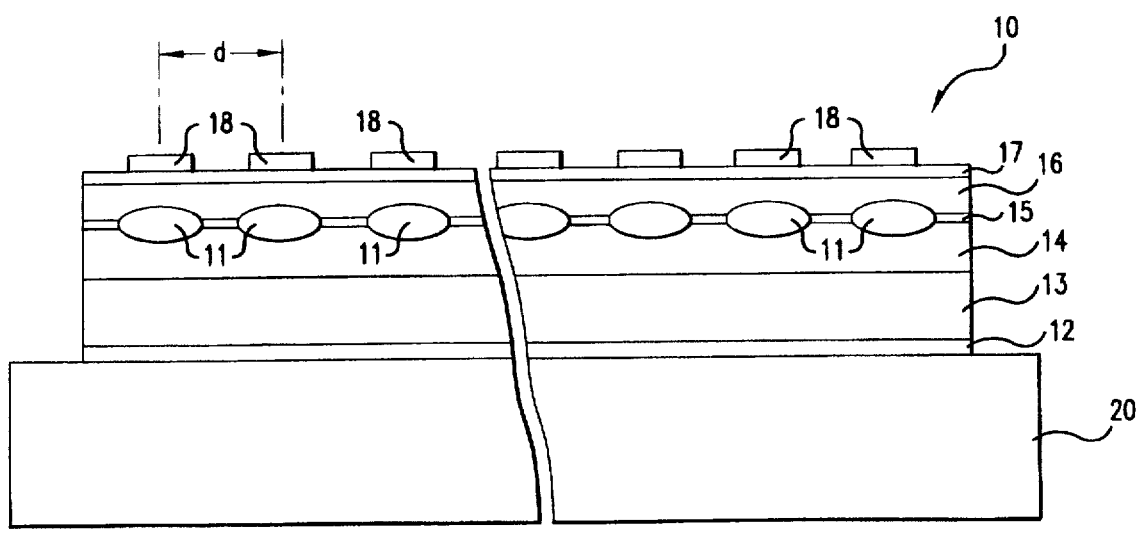
FIG. 1 is a typical sectional view of a semiconductor laser array to be driven by the present invention.

Referring to FIG. 1 showing a typical sectional view of a semiconductor laser array in a preferred embodiment according to the present invention, the semiconductor laser array 10 has 1200 light-emitting points 11 arranged in a single row at a pitch d of 21 μm, and a total length of 25.4 mm. The density of the light-emitting points 11 is 1200 dpi (dots per inch).

The semiconductor laser array 10 is fixed to a surface of an n-type common electrode 12 formed on a heat sink 20 for absorbing and dissipating heat. A 1.4 μm thick $Al_{0.6}Ga_{0.4}As$ cladding layer 14, a 210 nm thick active layer 15, a 1.4 μm thick p-type $Al_{0.6}Ga_{0.4}As$ cladding layer 16 and a p-type GaAs contact layer 17 are deposited in that order on a n-type GaAs substrate 13 in contact with the n-type common electrode 12. The active layer 15 is a three-layer structure consisting of a 100 nm thick n-type $Al_{0.3}Ga_{0.7}As$ confinement layer, a 10 nm thick nondoped GaAs quantum well layer and a 100 nm thick p-type $Al_{0.3}Ga_{0.7}As$ confinement layer superposed in that order. Formed on the p-type GaAs contact layer 17 are p-type electrodes 18 respectively corresponding to the light-emitting points 11.

Referring to FIG. 2 showing a timing chart of assistance in explaining a method of driving the semiconductor laser array 10, the n light-emitting points 11 are driven sequentially and recurrently in order of arrangement. When the light-emitting pulse width of each light-emitting point 11 is $t_w$, and the period of recurrence of driving is $t_p$, the duty factor of each light-emitting point 11 is $t_w/t_p$. The duty factor $t_w/t_p$ and the light-emitting pulse width $t_w$ are changed by changing the number of the light-emitting points 11 to be recurrently actuated, i.e., working light-emitting points 11.

Test semiconductor laser arrays similar to the semiconductor laser array 10 were driven by this driving method for life test to measure the variation of the light output of the semiconductor laser arrays with time. In this life test, groups each of twenty light-emitting points 11 were driven in different drive modes, respectively. Initial light output was set to 17 mW and the semiconductor laser arrays were placed in an ambience of 60° C. for accelerated deterioration test.

In a first drive mode (pulse drive mode), the semiconductor laser arrays were driven for 2000 hr by a driving signal of a pulse width $t_w$ of 200 ns and a duty factor of 0.2. In a second drive mode (CW drive mode), the semiconductor laser arrays were driven continuously for 2000 hr by a dc current. The results of tests in the first and the second drive modes are shown in FIGS. 3A and 3B, respectively.

Figure 3A:
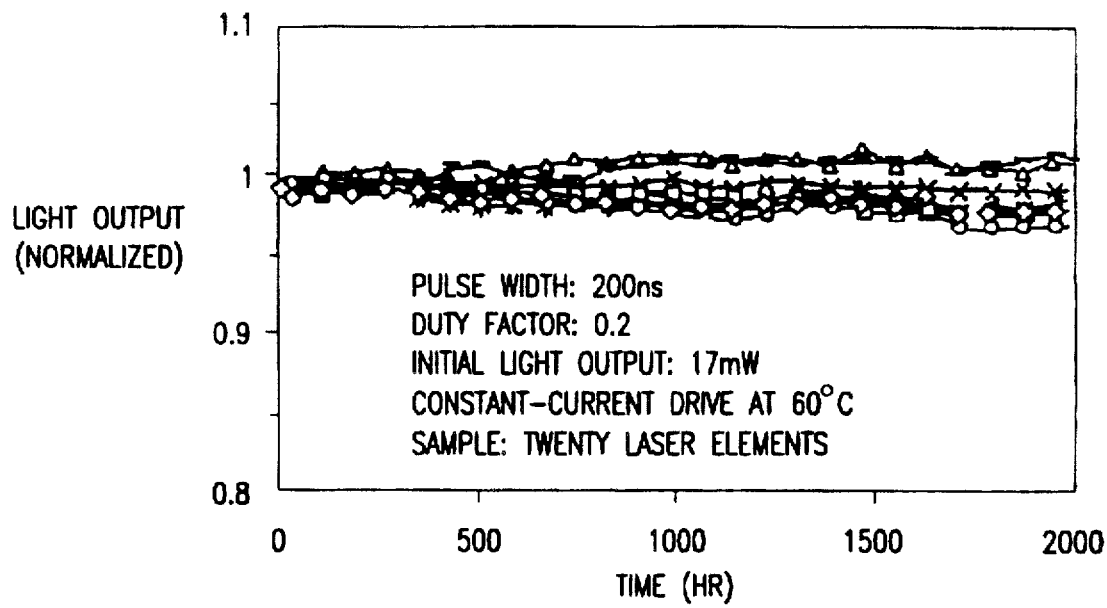
FIGS. 3A and 3B are graphs showing the results of life tests by way of example.
Figure 3B:
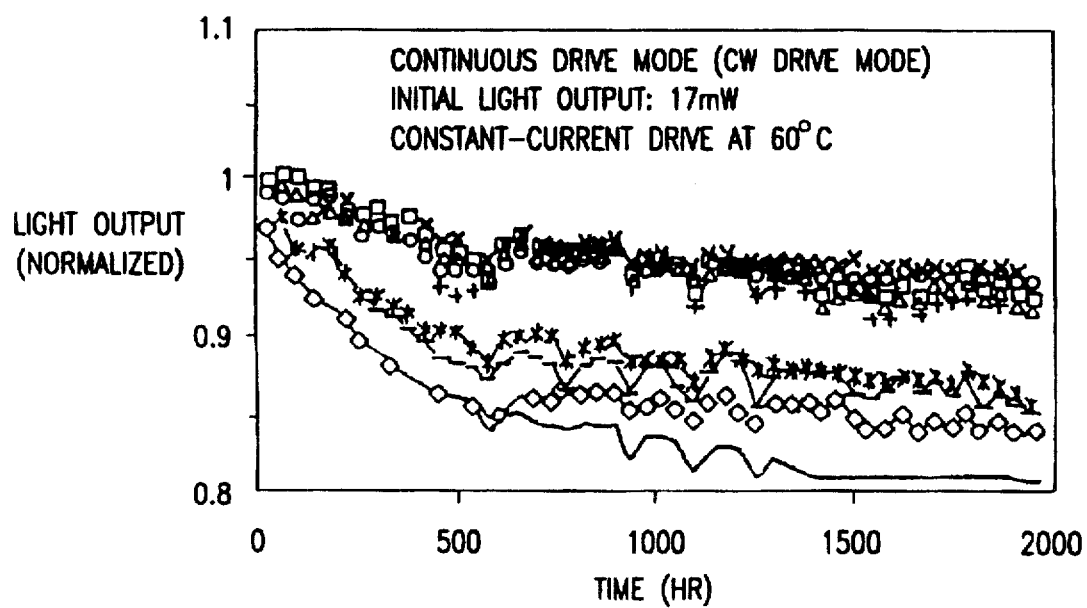

As is obvious from FIGS. 3A and 3B, the light outputs of the test semiconductor laser arrays decreased only slightly when the test semiconductor laser arrays were driven in the first drive mode, whereas the light outputs of the test semiconductor laser arrays decreased sharply in the initial stage of tests and then decreased gradually when driven in the second drive mode.

Figure 4:
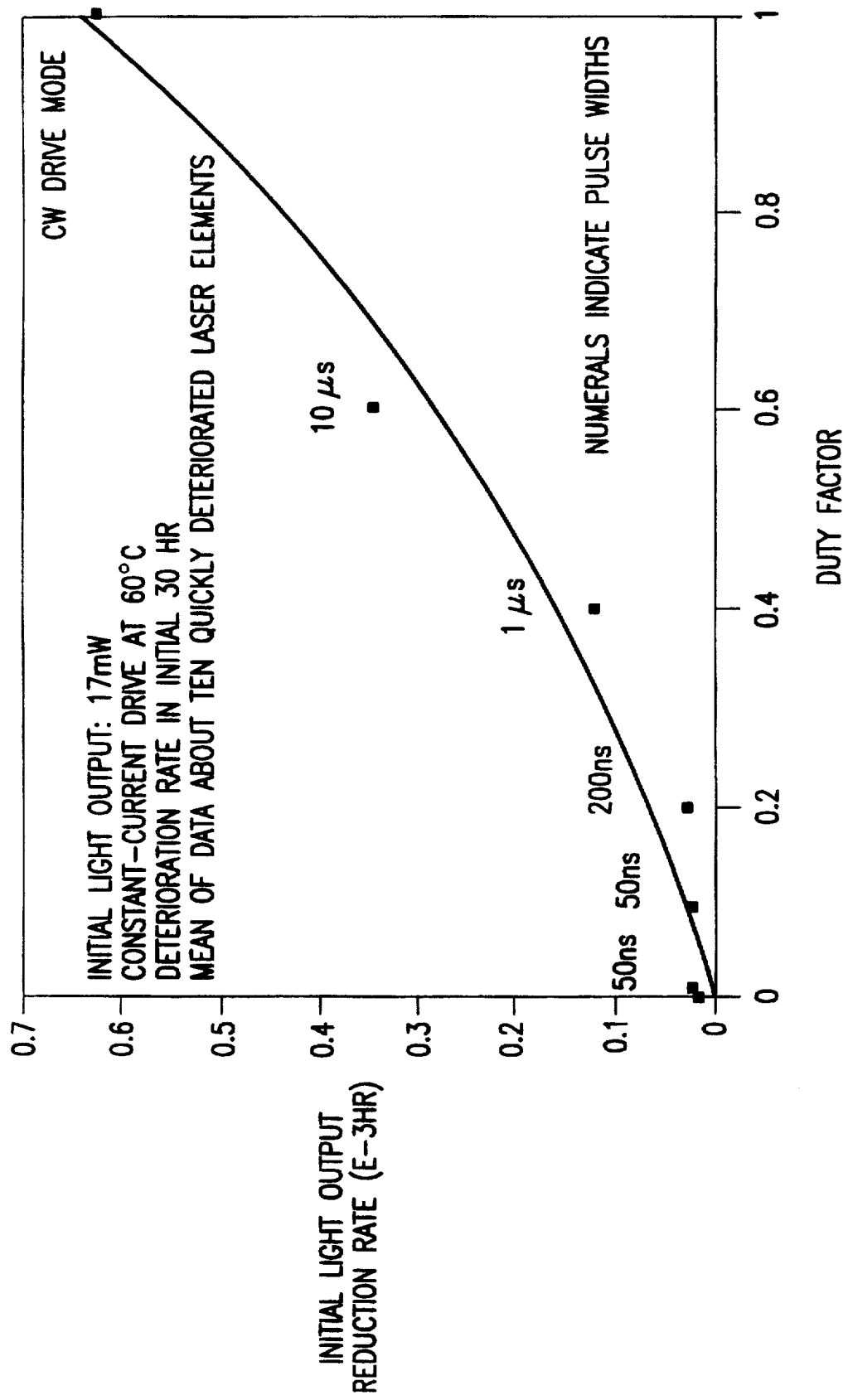
FIG. 4 is a graph showing the dependence of initial light output reduction rate on driving conditions.

FIG. 4 shows the dependence of the light output reduction rate in the initial test time of 30 hr on the duty factor for different pulse widths. Each of values of the light output reduction rates shown in FIG. 4 is the mean of the light outputs of ten light-emitting points which were deteriorated at higher light output reduction rates among the twenty light-emitting points. As is obvious from FIG. 4, the initial light output reduction rate does not vary in proportion to the duty factor but varies in nonlinear relation with the duty factor.

Figure 5:
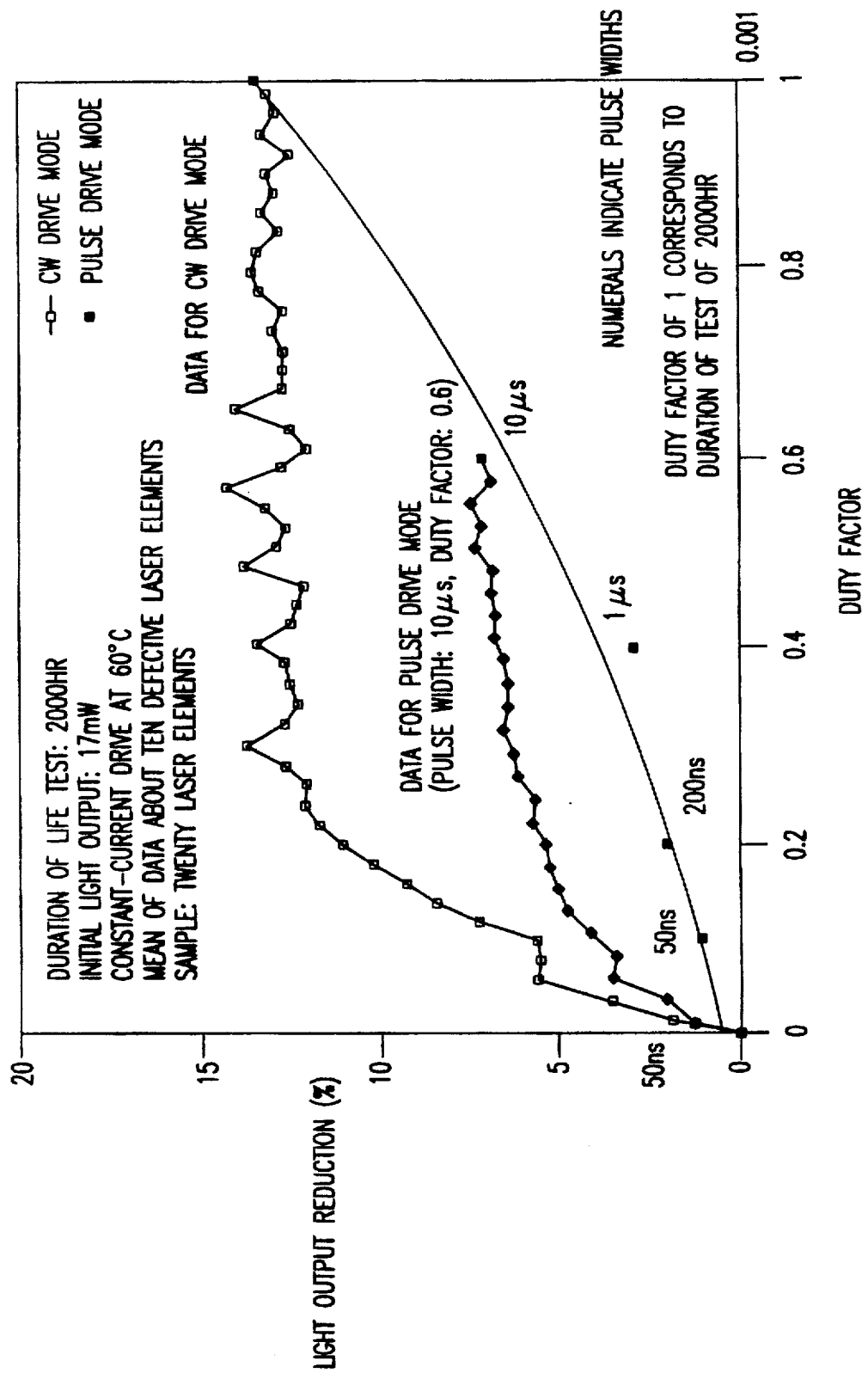
FIG. 5 is a graph showing the dependence of light output reduction after 2000 hr of operation on driving conditions.

FIG. 5 shows the relation between the light output reduction after 2000 hr of the life test and the duty factor, i.e., duty cycle. In FIG. 5, a duty factor of 1.0 signifies continuous supply of driving current for 2000 hr. For example, when the duty factor is 0.4, the total driving current supply time in the life test of 2000 hr is 2000×0.4=800 hr.

Shown also in FIG. 5 are the variation of light output reduction with time when the test semiconductor arrays were driven in the pulse drive mode and the CW drive mode. The cumulative current supply time is the total time in which the drive current was supplied actually, i.e., the sum of pulse widths. In this case, value "1" on the horizontal axis corresponds to 2000 hr.

As is obvious from FIG. 5, the curve indicating the variation of light output reduction with time when the semiconductor laser arrays were driven in the pulse drive mode, and the curve indicating the variation of light output reduction with time when the semiconductor laser arrays were driven in the CW drive mode differ from each other; that is, the difference of the effect of the pulse drive mode from that of the CW drive mode is dependent not only on the reduction of actual drive time but also on the duty factor, and the effect of the pulse drive mode on the suppression of light output reduction is more than that available from the reduction of actual drive time proportional to the duty factor. These data proves that the pulse drive mode reduces the rate of deterioration of the semiconductor laser arrays and extends the life of the semiconductor laser arrays. The ratio between the light output reductions for the same duty factor indicates the effect of the pulse drive mode on the extension of the life of the semiconductor laser arrays.

The test semiconductor laser arrays were driven by drive signals of the same duty factor and different pulse widths, respectively, for the same light output, and causes of changes in the test semiconductor laser arrays were examined. It was found that the amounts of temperature rise in the active layers of the test semiconductor laser arrays driven by the drive signals of different pulse widths are different from each other.

TABLE 1

Dependence of temperature rise in active layer on conditions for the pulse drive mode

| | Pulse width 50 ns | Pulse width 200 ns | Pulse width 1 μs | Pulse width 10 μs | CW drive mode (Pulse width: 1 ms) |
|---|---|---|---|---|---|
| Duty factor 1.0 | 5° C. | 5° C. | 5° C. | 5° C. | 5° C. |
| Duty factor 0.6 | 3.212° C. | 3.49° C. | 3.88° C. | 4.32° C. | 5° C. |

TABLE 1-continued

Dependence of temperature rise in active layer on conditions for the pulse drive mode

|  | Pulse width 50 ns | Pulse width 200 ns | Pulse width 1 μs | Pulse width 10 μs | CW drive mode (Pulse width: 1 ms) |
|---|---|---|---|---|---|
| Duty factor 0.4 | 2.318° C. | 2.73° C. | 3.32° C. | 3.98° C. | 5° C. |
| Duty factor 0.2 | 1.424° C. | 1.976 | 2.76° C. | 3.64° C. | 5° C. |
| Duty factor 1/10 | 0.977° C. | 1.598° C. | 2.48° C. | 3.47° C. | 5° C. |
| Duty factor 1/100 | 0.575° C. | 1.258° C. | 2.228° C. | 3.317° C. | 5° C. |
| Duty factor 1/1000 | 0.53° C. | 1.22° C. | 2.2° C. | 3.3° C. | 5° C. |

Temperature rise is the peak temperature of the semiconductor laser array when the semiconductor laser array is driven repeatedly. Temperature rise was calculated through the thermal analyzer simulation of the laser structure.

Table 1 shows the relation between the amounts of temperature rise in the active layers obtained through simulation for the thermal analysis of the laser structure, and conditions for the pulse drive mode. It is known from Table 1 that the amount of temperature rise decreases as the pulse width is reduced even if the duty factor is fixed, and the amount of temperature rise in the active layers decreases as the duty factor decreases even if the pulse width is fixed.

Figure 6:
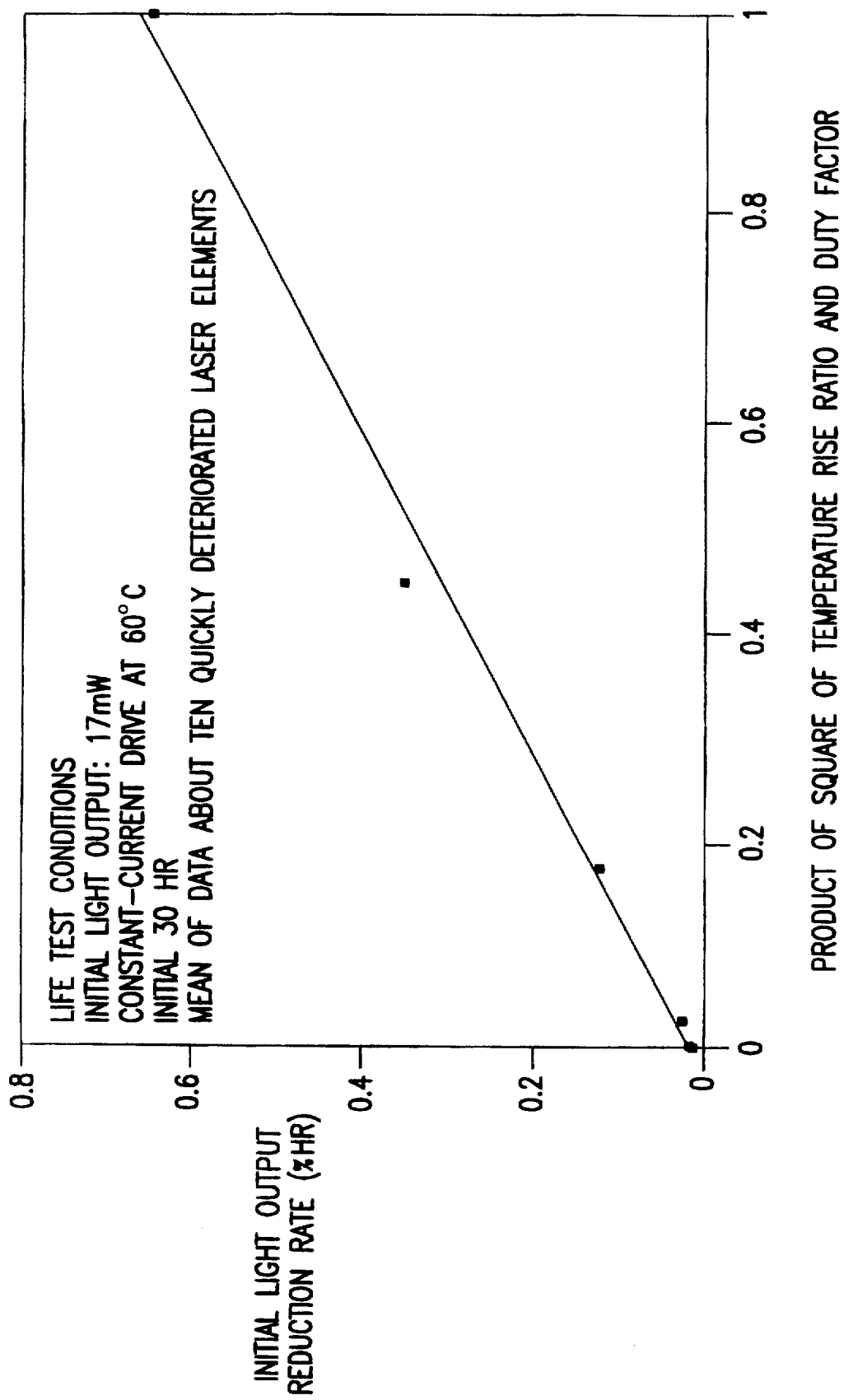
FIG. 6 is a graph showing the relation between the product of the square of the peak temperature ratio of an active layer and a duty factor, and the initial light output reduction rate.
Figure 7:
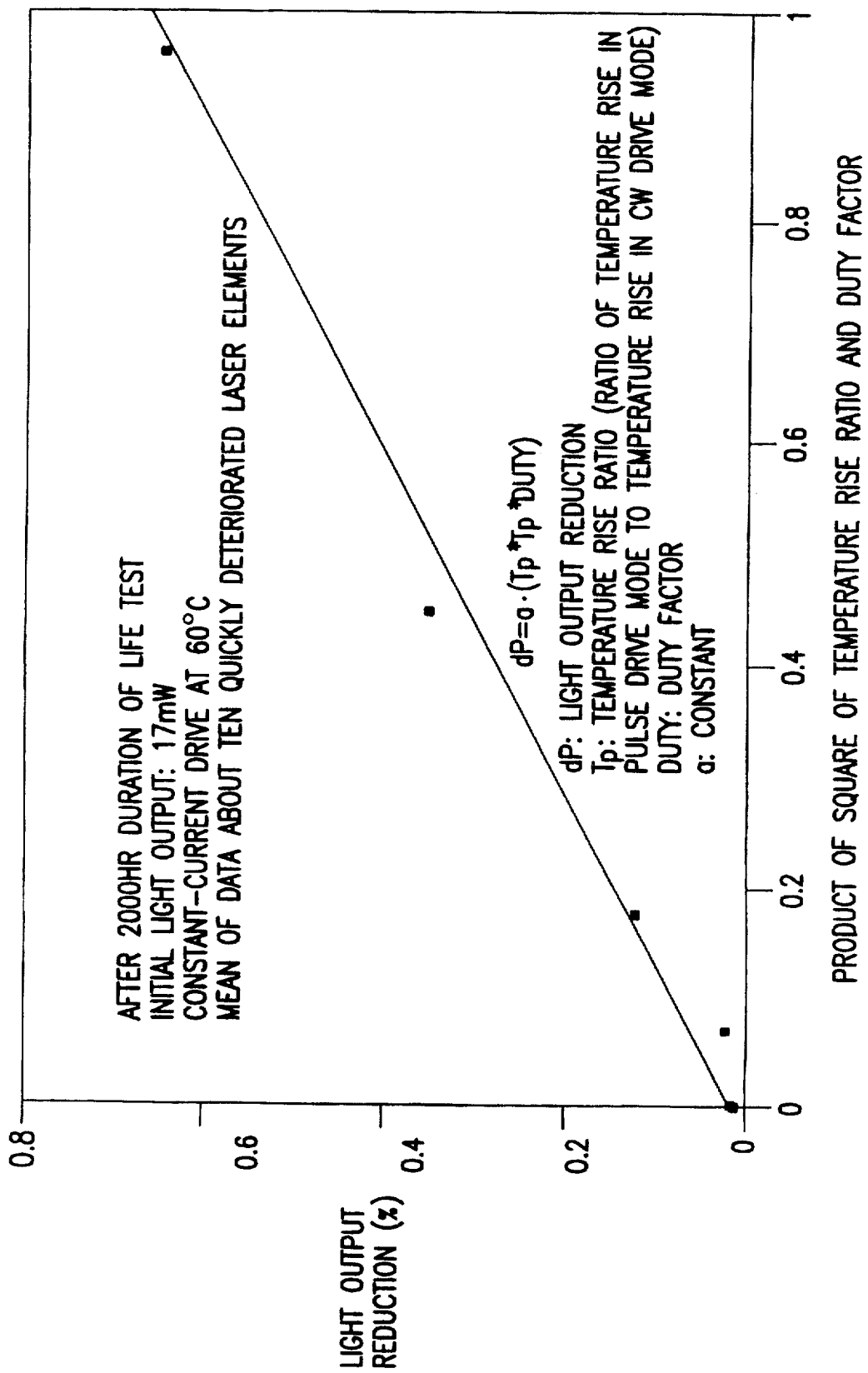
FIG. 7 is a graph showing the relation between the product of the square of the peak temperature ratio of an active layer and a duty factor, and light output reduction rate after 2000 hr of operation.

The relation between the temperature rise in the active layers and the initial light output reduction rate (30 hr) was examined. As shown in FIG. 6, the initial light output reduction rate (30 hr) is approximately proportional to the product of the square of the temperature rise ratio $\Delta T_1/\Delta T_0$, where $\Delta T_1$ is a temperature rise in the pulse drive mode and $\Delta T_0$ is a temperature rise in the CW drive mode, and the duty factor. It is known from FIG. 7 that the light output reduction increases linearly with the product of the square of the temperature rise ratio $\Delta T_1/\Delta T_0$ and the duty factor. Thus, it is known that the life of the semiconductor laser arrays can be extended substantially in proportion to the product of the square of the temperature rise ratio and the duty factor, when the semiconductor laser arrays are driven in the pulse drive mode to suppress rise in temperature of the active layers, and a drive signal of a small duty factor is used.

Life extension coefficient $P_0/P_1$ ($P_0$ is the light output reduction when the semiconductor laser arrays are drive in the CW drive mode, and $P_1$ is the light output reduction when the semiconductor laser arrays are driven in the pulse drive mode) indicating the life extending effect was calculated from the temperature rise ratio and the duty factor on the basis of the foregoing relations. Calculated values of life extension coefficient are shown in Table 2. The life extension coefficient is the ratio between the light output reduction caused by the CW drive mode and that caused by the pulse drive mode in the same current supply time. Since the current supply time is the product of working time and the duty factor in the pulse drive mode, a value obtained by dividing the life extension coefficient by the duty factor represents estimated life. Parenthesized values in Table 2 are values of estimated life.

TABLE 2

Dependence of life extension coefficient on conditions for the pulse drive mode

|  | Pulse width 50 ns | Pulse width 200 ns | Pulse width 1 μs | Pulse width 10 μs | CW driven mode (Pulse width: 1 ms or above) |
|---|---|---|---|---|---|
| Duty factor 1.0 | 1 (1) | 1 (1) | 1 (1) | 1 (1) | 1 (1) |
| Duty factor 0.6 | 2.4 (4.0) | 2.1 (3.4) | 1.6 (2.7) | 1.3 (2.2) | 1 (1.6) |
| Duty factor 0.4 | 4.7 (11) | 3.3 (8.3) | 2.3 (5.6) | 1.6 (3.9) | 1 (2.5) |
| Duty factor 0.2 | 12 (61) | 6.4 (32) | 3.3 (16) | 1.9 (9.4) | 1 (5) |
| Duty factor 1/10 | 26 (260) | 9.7 (97) | 4.1 (40) | 2.1 (20) | 1 (10) |
| Duty factor 1/100 | 75 (7500) | 15 (1500) | 5.0 (500) | 2.2 (220) | 1 (100) |
| Duty factor 1/1000 | 88 (88000) | 16 (16000) | 5.2 (5100) | 2.3 (2200) | 1 (1000) |

Life extension coefficient is the ratio of the light output reduction when the semiconductor laser arrays are drive in the CW drive mode and the light output reduction when the semiconductor laser arrays are driven in the pulse drive mode for the same drive time. Parenthesized values indicate (Expected life) = (Life extension coeffient)/(Duty factor).

Figure 8:
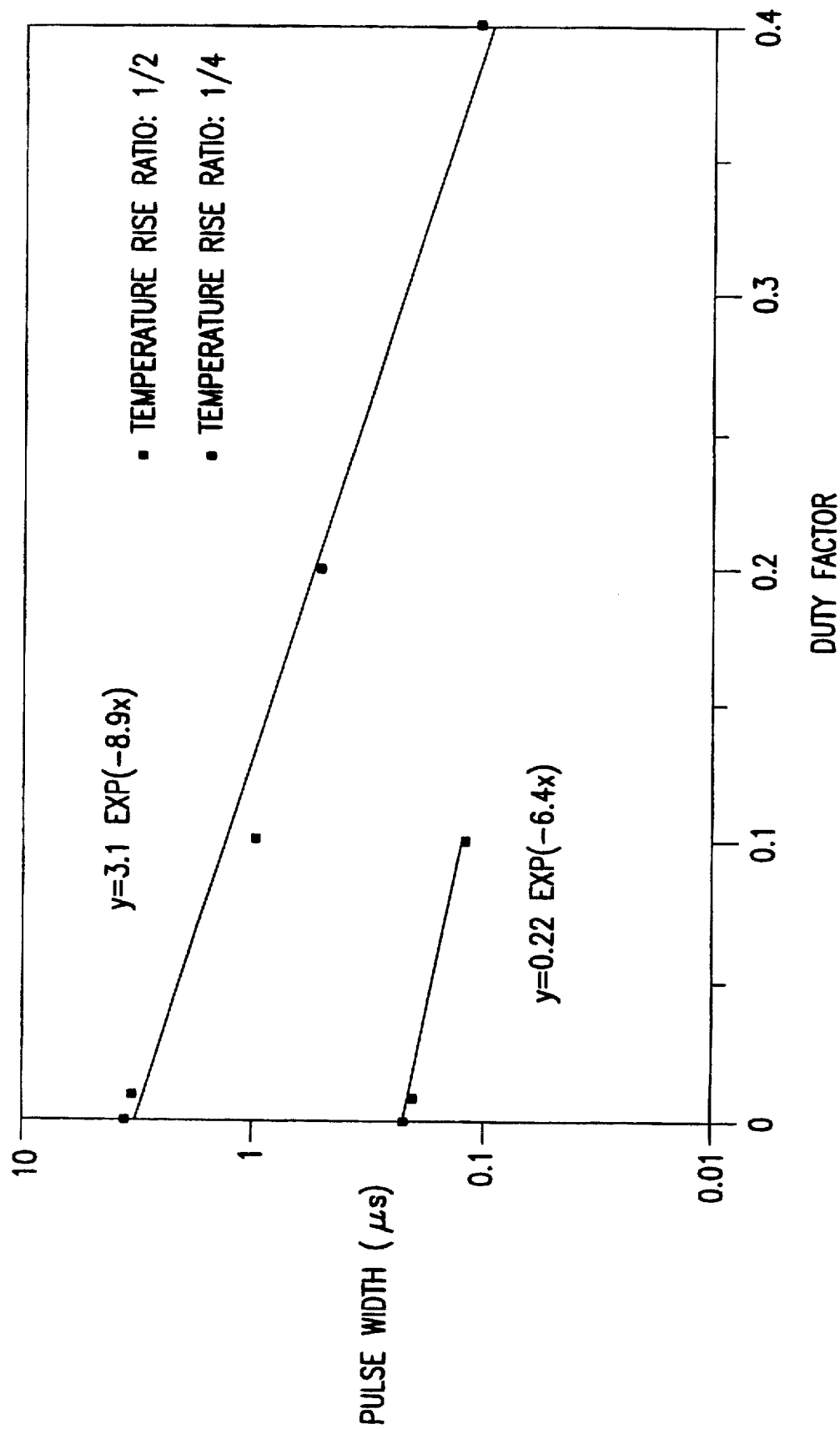
FIG. 8 is a graph showing the relation between a pulse width and a duty factor, meeting conditions for extending the life of semiconductor laser arrays.

The relations between the pulse drive mode and the life extension coefficient and between the pulse drive mode and the estimated life were thus determined. The life extension coefficient is 4 or above when $\Delta T_1/\Delta T_0 < \frac{1}{2}$, and is 16 when $\Delta T_1/\Delta T_0 < \frac{1}{4}$. FIG. 8 is a graph showing the relation between the pulse width and the duty factor meeting those conditions. It was found that the relation between the duty factor x and the pulse width y (μs) meets an inequality: $y < 3.1 \exp(-8.9x)$ when $\Delta T_1/\Delta T_0 < \frac{1}{2}$, and meets an inequality: $y < 0.22 \exp(-6.4x)$ when $\Delta T_1/\Delta T_0 < \frac{1}{4}$.

Figure 9:
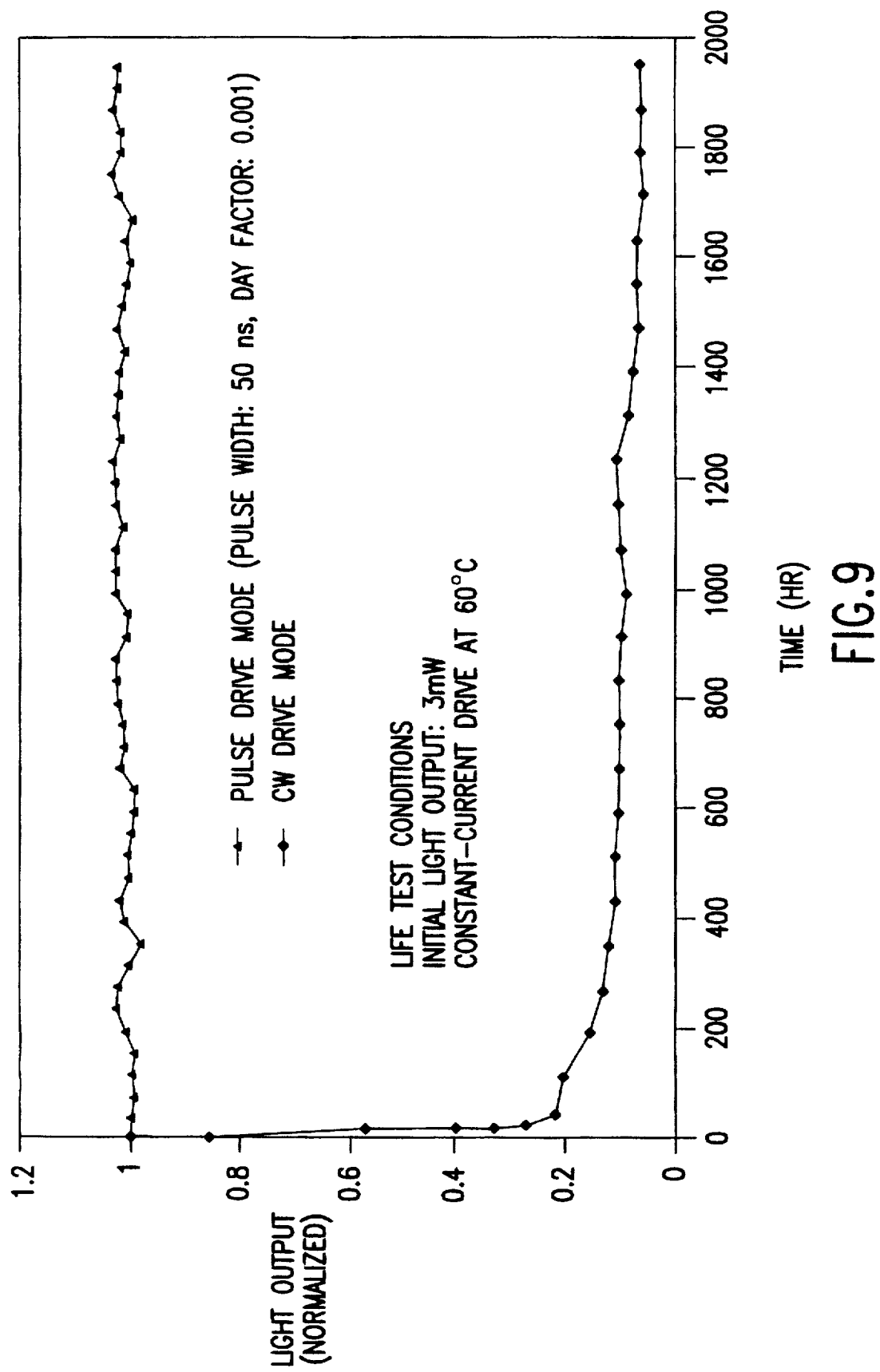
FIG. 9 is a graph showing the variation of light output of a laser having a short life with time when the laser is driven by a driving pulse signal of a short pulse width.

The semiconductor laser elements were subjected to a life test to examine the effect of the pulse drive mode on the extension of the life of the semiconductor laser elements. FIG. 9 shows the results of the life test. Semiconductor laser elements having very bad laser characteristics and expected to malfunction in a short working time when driven in the CW drive mode were used as the test samples. First 2000 hr life tests were conducted, in which the test laser elements were driven in the pulse drive mode using a drive signal of 0.001 in duty factor and 50 ns in pulse width. Light output was 3 mW, constant-current drive was employed and the ambient temperature was 60° C. As is obvious from FIG. 9, the light output was not reduced at all after a working time of 2000 hr. The same test laser elements were driven in the CW drive mode to examine the reduction of light output. As is obvious from FIG. 9, the light output was reduced by 15% in 2 hr, 50% in 15 hr and 80% in 100 hr. The test results proved that the test laser elements are defective laser elements which is not suitable at all for use in which the laser elements are driven in the CW drive mode.

Those test results proved that the life of the laser elements when driven in the pulse drive mode is at least 6000 times that of the same when driven in the CW drive mode. It is expected from the results of simulation of the temperature rise in the active layers that the life of the laser elements when driven in the pulse drive mode is 88000 times that of the same when driven in the CW drive mode as shown in Table 2. Results of other experiments will be described below.

An edge-emitting laser array provided with 120 light-emitting points was fabricated. The laser characteristics including a threshold current, a driving current for 20 mW in light output, slope efficiency (electron/light conversion efficiency) and a dc resistance were measured. Nondefective light-emitting points were sorted from defective light-emitting points resorting to inspection standards requiring that light-emitting points having expected life of less than 100 hr when driven in the CW drive mode be decided to be defective and those having expected life of 100 hr or above be decided to be nondefective. Eight light-emitting points among the 120 light-emitting points were defective.

When the edge-emitting laser array is to be applied to a laser printer or the like, the life of the light-emitting points must be 2400 hr or above. When the edge-emitting laser array provided with the 120 light-emitting points is driven by a driving signal of 1/120 in duty factor, the light-emitting points are actuated for 2400/120=20 hr when the edge-emitting laser array is operated for 2400 hr. Since the life is extended by four times when $\Delta T_1/\Delta T_0 = \frac{1}{2}$, necessary life of the light-emitting points when driven in the CW drive mode is 5 hr.

From such a point of view, the eight defective light-emitting points of the edge-emitting laser array were driven for five hours in the CW drive mode and output reduction was measured. The greatest output reduction among those in the eight light-emitting elements was 20%, which is an allowable output reduction for nondefective light-emitting elements.

When the operating conditions meet $\Delta T_1/\Delta T_0 = \frac{1}{2}$, the semiconductor laser array having the 120 light-emitting points including the eight light-emitting points which are regarded as defective light-emitting points according to ordinary inspection standards and regarded as useless can be accepted as a nondefective semiconductor laser array when the semiconductor laser array is to be driven in the pulse drive mode.

Thus, it was found that the life of the semiconductor laser array can remarkably be extended by driving the semiconductor laser array in the pulse drive mode. The life of the semiconductor laser array when driven in accordance with the driving conditions meeting $\Delta T_1/\Delta T_0 = \frac{1}{2}$ is as long as sixteen times that of the same when driven in the CW drive mode. Therefore, semiconductor laser arrays which has been regarded as defective in accordance with the ordinary inspection standards can be used with very high reliability and have sufficiently long life when the semiconductor laser arrays are driven in the pulse drive mode.

Although the foregoing tests tested the edge-emitting laser arrays and the life extending effect of the semiconductor laser array driving method of the present invention has been demonstrated, the life extending effect of the semiconductor laser array driving method of the present invention is effective also in extending the life of general semiconductor laser arrays, such as vertical-cavity surface-emitting semiconductor laser arrays, because those semiconductor laser arrays are basically the same in structure and the principle of operation as the edge-emitting semiconductor laser arrays subjected to the tests.

Figure 10:
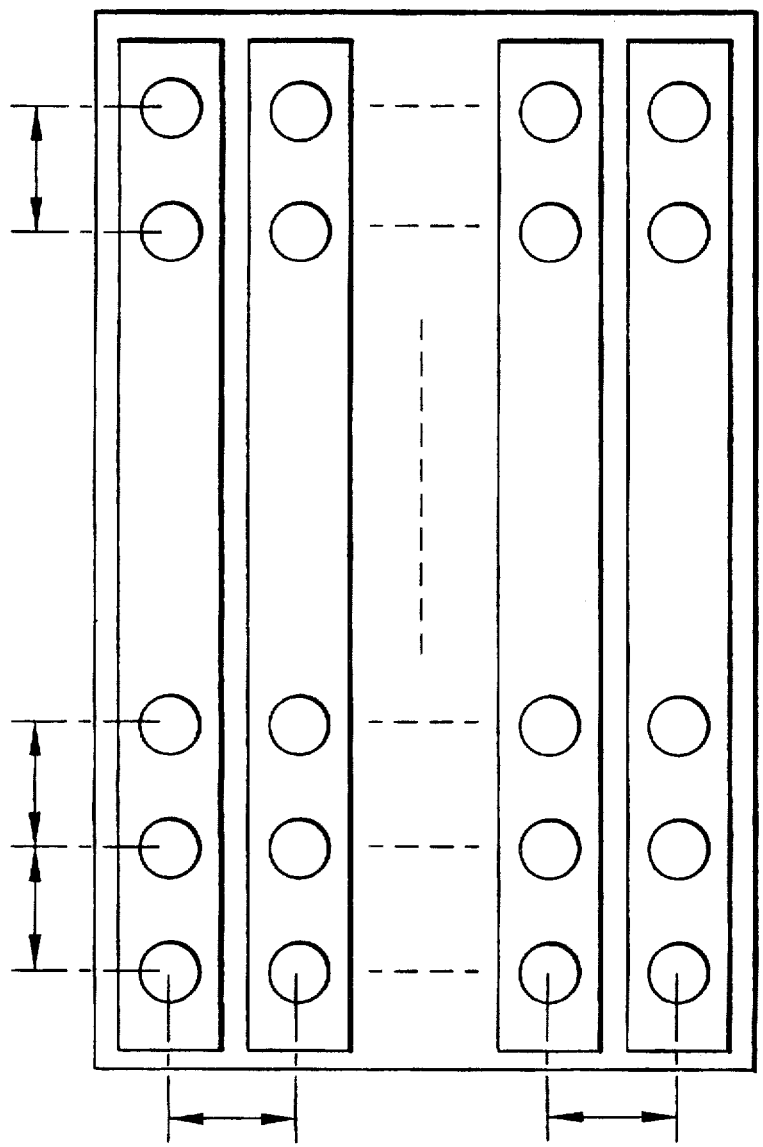
FIG. 10 is a typical view showing an arrangement of semiconductor laser elements.

FIG. 10 is a typical view showing the structure of a surface laser array having 100 light-emitting points. The 100 light-emitting points are arranged two-dimensionally in a 10×10 matrix at a pitch of 21 μm in a density of 1200 dpi. The light-emitting points are divided into ten sections each consisting of ten light-emitting points arranged in a row. The semiconductor laser array driving method of the present invention is directly applicable to the surface laser array.

Figure 11:
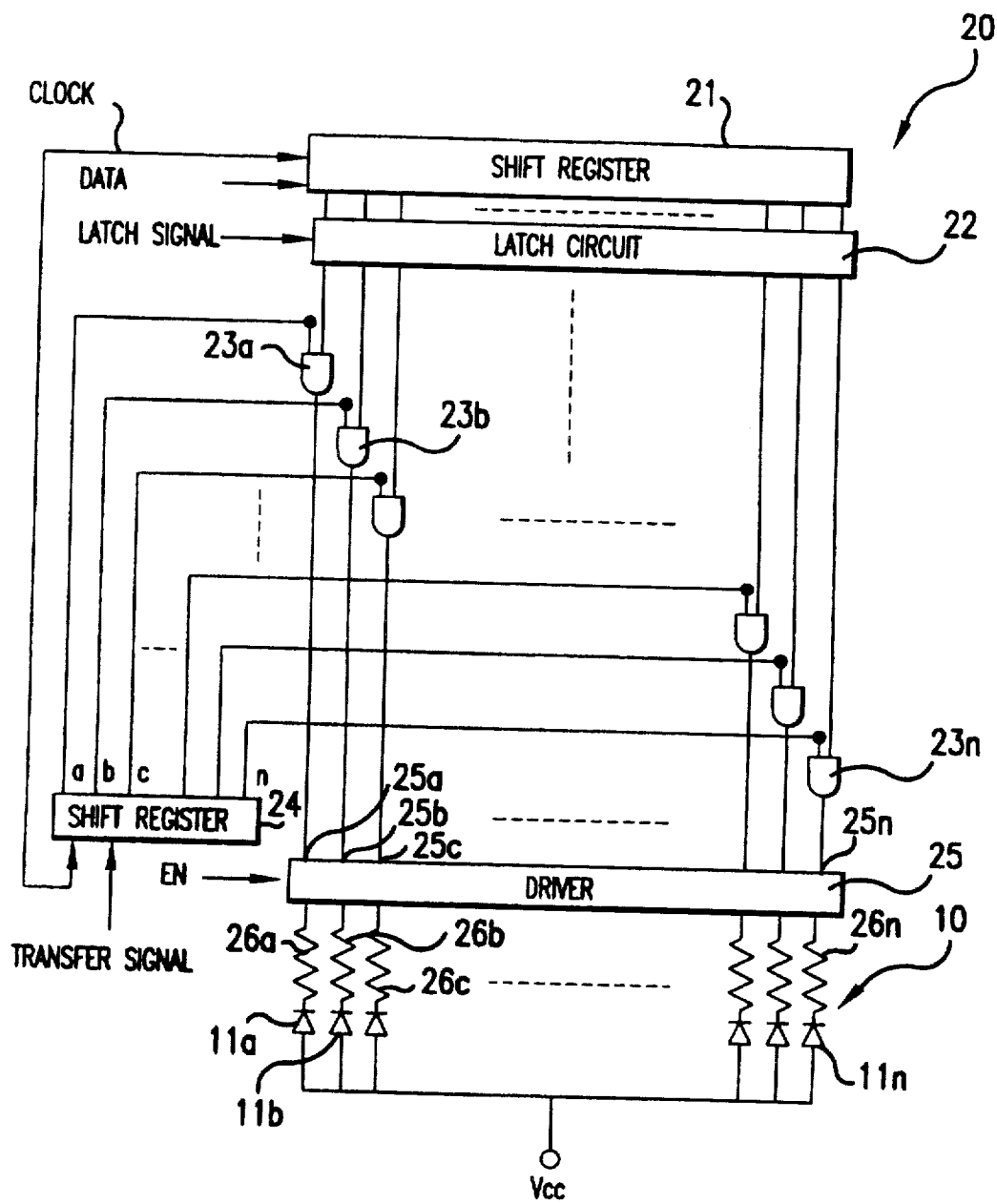
FIG. 11 is a block circuit diagram of a semiconductor laser array driving device in a preferred embodiment according to the present invention.

A semiconductor laser array driving device 20 in a preferred embodiment according to the present invention will be described hereinafter with reference to FIGS. 11 and 12 as applied to driving a semiconductor laser array 10 having light-emitting elements (light-emitting points) 11a, 11b, . . . 11n. FIG. 11 is a block diagram of the semiconductor laser array driving device 20 and FIG. 12 is a timing chart of assistance in explaining the operation of the semiconductor laser array driving device 20.

Figure 12:
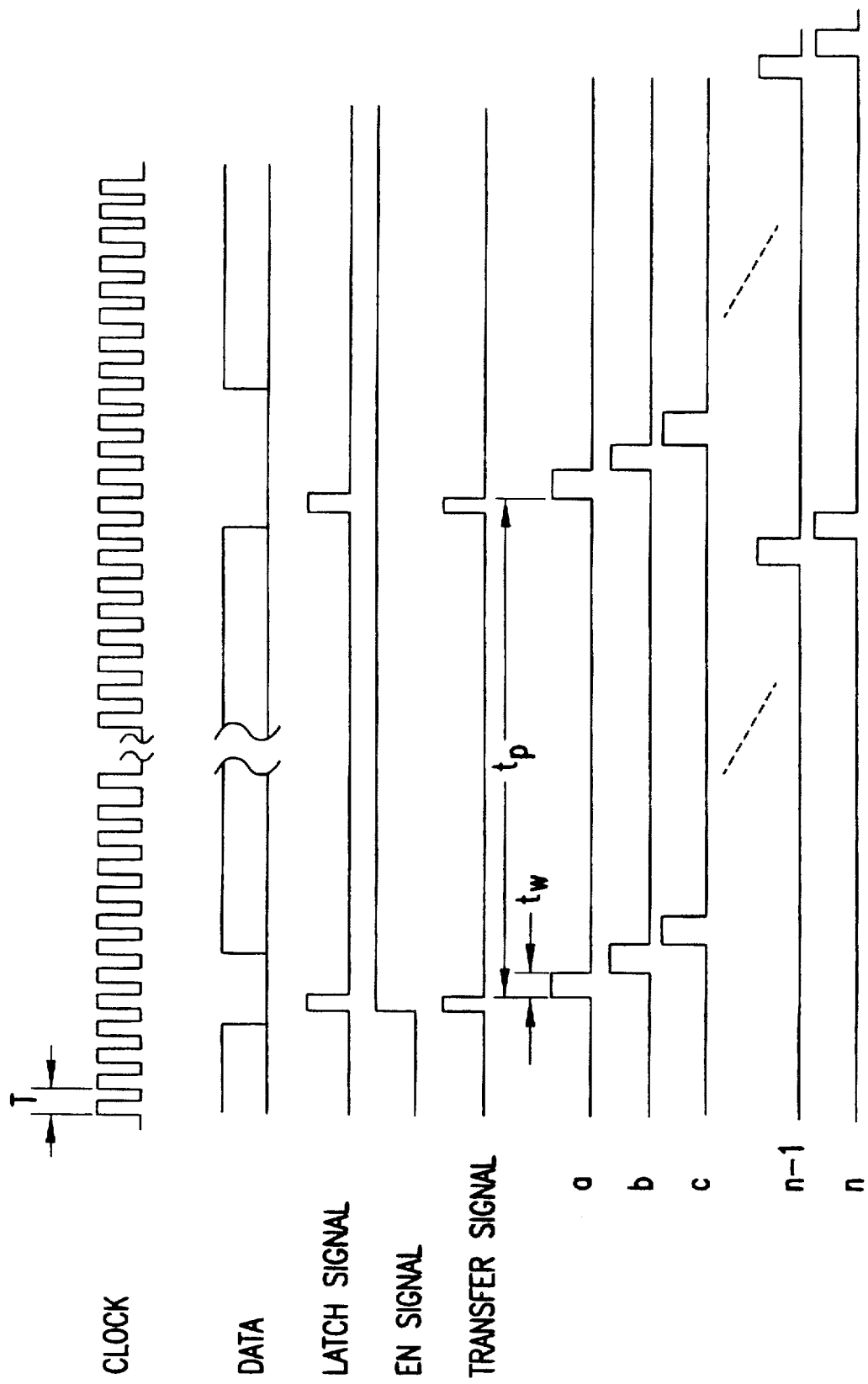
FIG. 12 is a timing chart of assistance in explaining the operation of the semiconductor laser array driving device of FIG. 11.

Referring to FIGS. 11 and 12, serial data indicating the light-emitting elements to be driven and those not to be driven is given to a shift register 21 included in the semiconductor laser array driving device 20, and the shift register 21 stores the data. Then, a latch signal is given to a latch circuit 22, and the latch circuit 22 stores the data stored in the shift register 21 in a parallel mode. Then, the next data is given to the shift register 21. The shift register 21 and the latch circuit 22 constitute a signal input unit.

The data latched by the latch circuit 22 is given in a parallel input mode to AND gates 23a, 23b, . . . and 23n and, at the same time, parallel outputs a, b, . . . and n from another shift register 24 are given to the AND gates 23a, 23b, . . . and 23n. The AND gates 23a, 23b, . . . and 23n, and the shift register 24 constitute a light emission control circuit.

A transfer signal "1 0 0 . . . 0 0" is given to the shift register 24 and the transfer signal is shifted at each clock pulse. Consequently, as shown in FIG. 12 a pulse signal of logic 1 is given to the AND gates 23a, 23b, . . . and 23n in order of the parallel outputs a, b, . . . and n. When the data about the states of the light-emitting elements 11a, 11b, . . . and 11n latched by the latch circuit 22 indicate light emission, i.e., when the data are logical 1, the AND gates 23a, 23b, . . . and 23n give pulse signals of logical 1 to a driver 25 upon the reception of the pulse signals of logical 1, respectively, from the shift register 24.

When a pulse signal is applied to any one of input terminals 25a, 25b, . . . and 25n respectively connected to the AND gates 23a, 23b, . . . and 23n while an enable signal EN is in logical 1, the driver 25 connects a resistor corresponding to the input terminal to which the pulse signal is applied, among resistors 26a, 26b, . . . and 26n to a ground. Then, a pulse current supplied by a power supply Vcc flows through the corresponding light-emitting element, i.e., one of the light-emitting elements 11a, 11b, . . . and 11n, and the corresponding resistor, i.e., one of the resistors 26a, 26b, . . . and 26n, whereby the light-emitting element connected to the grounded resistor is driven for light emission.

Even if a pulse signal of logic 1 is given to the AND gates 23a, 23b, . . . and 23n by the shift resister 24, the light-emitting elements corresponding to the AND gates 23a, 23b, . . . and 23n are not driven for light emission when the data latched by the latch circuit 22 and corresponding to the AND gates 23a, 23b, . . . and 23n are logic 0, i.e., data not indicating light emission.

While a light-emitting element control cycle for selectively driving the light-emitting elements 11a, 11b, . . . and 11n is being carried out, new data is given to the shift register 21, the new data given to the shift resister 21 is latched by the latch circuit 22 upon the completion of the light-emitting element control cycle, and then the next light-emitting element control cycle is started.

In this embodiment, the period T of the clock is less than 3 μs and hence one light-emitting time interval $t_w$ of the light-emitting elements 11a, 11b, ... and 11n is less than 3 μs. A duty factor $t_w/t_p$ is determined by the pattern of the transfer signal given to the shift register 24. In this embodiment, the pattern of the transfer signal is determined so that the duty factor $t_w/t_p = 1/100$ (1%) or below, i.e., so that 100 or more light-emitting elements are controlled recurrently for light emission.

The light-emitting elements 11a, 11b, ... and 11n of the semiconductor laser array 10 are controlled sequentially and recurrently for selective light emission. Therefore, in this embodiment, all the component light-emitting elements 11a, 11b, ... and 11n of the semiconductor laser array 10 are, in designation used herein, working light-emitting points. When only some of the component light-emitting elements 11a, 11b, ... and 11n of the semiconductor laser array 10 are driven by the semiconductor laser array driving device 20, only those light-emitting elements driven by the semiconductor laser array driving device are regarded as working light-emitting points.

Figure 13:
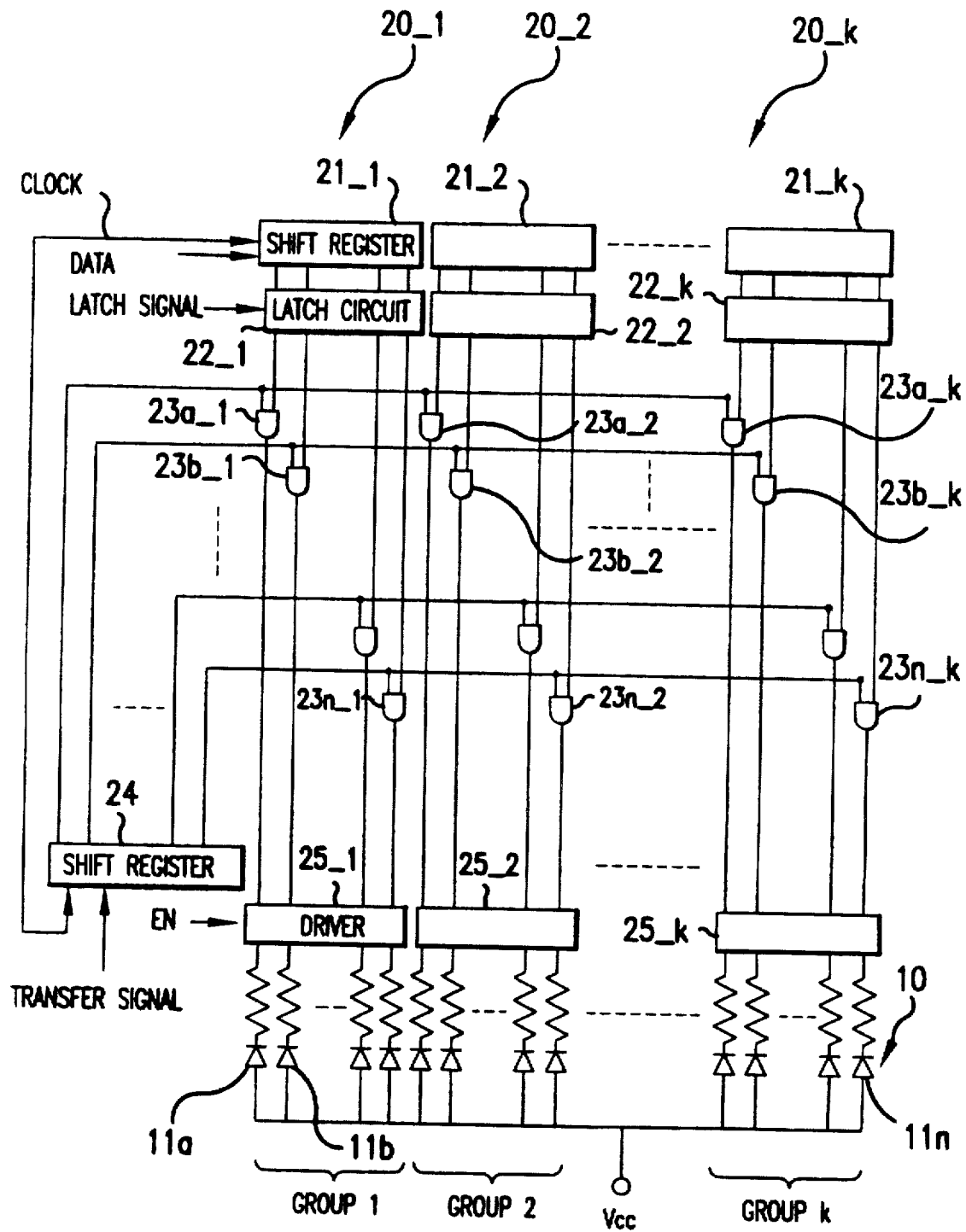
FIG. 13 is block circuit diagram of a semiconductor laser array driving device in another embodiment according to the present invention.

FIG. 13 is a block diagram of a semiconductor laser array driving device 30 in another embodiment according to the present invention. The semiconductor laser array driving device 30 is designed to drive light-emitting elements (light-emitting points) 11a, 11b, ... and 11n divided into k groups, i.e., groups 1 to k.

Referring to FIG. 13, the semiconductor laser array driving device 30 comprises shift registers 21_1, 21_2, ... and 21_k, latch circuits 22_1, 22_2, ... and 22_k, groups of AND gates 23a_1, 23b_1, ... 23n_1, AND gates 23a_2, 23b_2, ... and 23n_2, ... and AND gates 23a_k, 23b_k, ... and 23n_k, and drivers 25_1, 25_2, ... and 25_k, corresponding to the shift register 21, the latch circuit 22, the AND gates 23a, 23b, ... and 23n, and the driver 25 of the semiconductor laser array driving device shown in FIG. 11, respectively. In this embodiment, the light-emitting elements 11a, 11b, ... and 11n are divided into the k groups, and the k groups of the light-emitting elements 11a, 11b, ... and 11n are driven by semiconductor laser array driving units 20_1, 20_2, ... and 20_k, respectively. The k semiconductor laser array driving units 20_1, 20_2, ... and 20_k share a single shift register 24.

The semiconductor laser array driving units 20_1, 20_2, ... and 20_k regard the light-emitting elements of the corresponding group as, in designation herein, working light-emitting points.

The light-emitting elements 11a, 11b, ... and 11n (light-emitting points) may be arranged in a row and divided into the groups 1 to k or may be arrange in a two-dimensional arrangement and divided in rows or sections as shown in FIG. 10.

In the semiconductor laser array driving device 30 shown in FIG. 13, the period T of the clock and the pattern of the transfer signal are determined so that the duty factor is 10% or below and the width of drive pulses is 0.1 μs or below.

Figure 14:
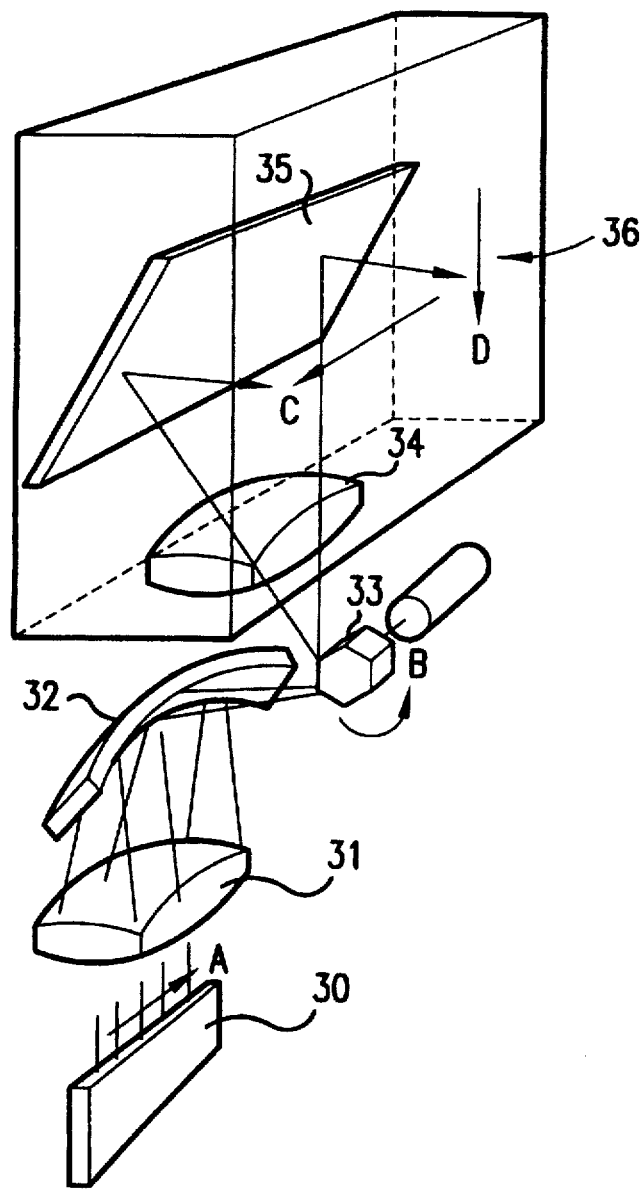
FIG. 14 is a typical perspective view of an image forming apparatus in another embodiment according to the present invention in the form of a display apparatus.

FIG. 14 a typical perspective view of an image forming apparatus embodying the present invention. The image forming apparatus is provided with a semiconductor laser array 10 having a linear arrangement of twelve semiconductor laser chips each having a length of 25.4 mm and 600 light-emitting points. Therefore, the semiconductor laser array 10 has 7200 light-emitting points in total. The semiconductor laser array 10 emits laser light of 650 nm in wavelength in the visible region.

The light-emitting points of the semiconductor laser array 10 are divided into twelve groups, i.e., the twelve semiconductor array units, and the semiconductor laser array 10 is driven by the semiconductor laser array driving device 30 shown in FIG. 13.

Image data representing an image is given to the semiconductor laser array driving device 30 to control the light-emitting elements 11a, 11b, ... and 11n of the semiconductor laser array 10 for selective light emission. The light-emitting elements of each group are controlled sequentially in order of arrangement in the direction of the arrow A according to the image data.

Laser beam emitted by the semiconductor laser array 10 travels through a field lens 31 and falls on a spherical mirror 32, and the spherical mirror 32 reflects the laser beam onto a polygonal rotating mirror 33. The laser beam deflected by the polygonal rotating mirror 33 travels through an fθ lens (doublet spatial lens) 34 and falls on a plane mirror 35. The plane mirror 35 reflects the laser beam onto a display screen 36. The direction in which the light-emitting points of the semiconductor laser array 10 are arranged corresponds to a scanning direction. When the laser beam emitted by the semiconductor laser array 10 moves in the direction of the arrow A, the laser beam scans the display screen 36 in the direction of the arrow C. The laser beam is focused on the display screen 36 by the field lens 31 and the spherical mirror 32.

The polygonal rotating mirror 33 in this embodiment is a hexahedral mirror and is rotated at 600 rpm in the direction of the arrow B. Each face of the polygonal rotating mirror 33 feeds the laser beam once in the direction of the arrow D on the display screen 36 and hence sixty frames are projected every 1 s.

The fθ lens 34 is employed to scan the middle region and end regions of the display screen 36 at the same scanning speed. The plane mirror 35 is effective in constructing the image forming apparatus in a thin structure. The display screen 36 is a translucent, white film of 1200 mm by 90 mm capable of clearly displaying on its front surface an image projected on its back surface.

In this image forming apparatus thus constructed, a driving pulse current representing image information is supplied to the semiconductor laser array 10 to drive the semiconductor laser array 10 to form an image on the display screen 36 by the laser beams emitted by the semiconductor laser array 10. In this embodiment, the driving pulse current has a pulse width of 31 ns and a duty factor of 1/100. Super-high-definition images of 7200×5400 pixels can be formed by using this driving pulse current. Such a definition is very high as compared with the current highest definition of 1000×2000 pixels. Images can be displayed on the display screen 36 in thirty-six tones in a dot density of 25 dpi.

Although the image forming apparatus in this embodiment employs a red semiconductor laser array that emits a red laser beam, the image forming apparatus may additionally be provided with a green semiconductor laser array that emits a green laser beam and a blue semiconductor laser array that emits a blue laser beam to display a full-color image on the display screen 36 by using the red, the green and the blue laser beams in combination. When the image forming apparatus is provided with the red, the green and the blue semiconductor laser arrays, images can be displayed in 46656 colors in a dot density of 25 dpi.

An image forming apparatus in another embodiment according to the present invention will be described hereinafter. An image forming apparatus, such as a copying machine or a laser print, that carries out an electrophotographic image forming process will briefly be explained prior to the description of the image forming apparatus embodying the present invention.

Figure 15:
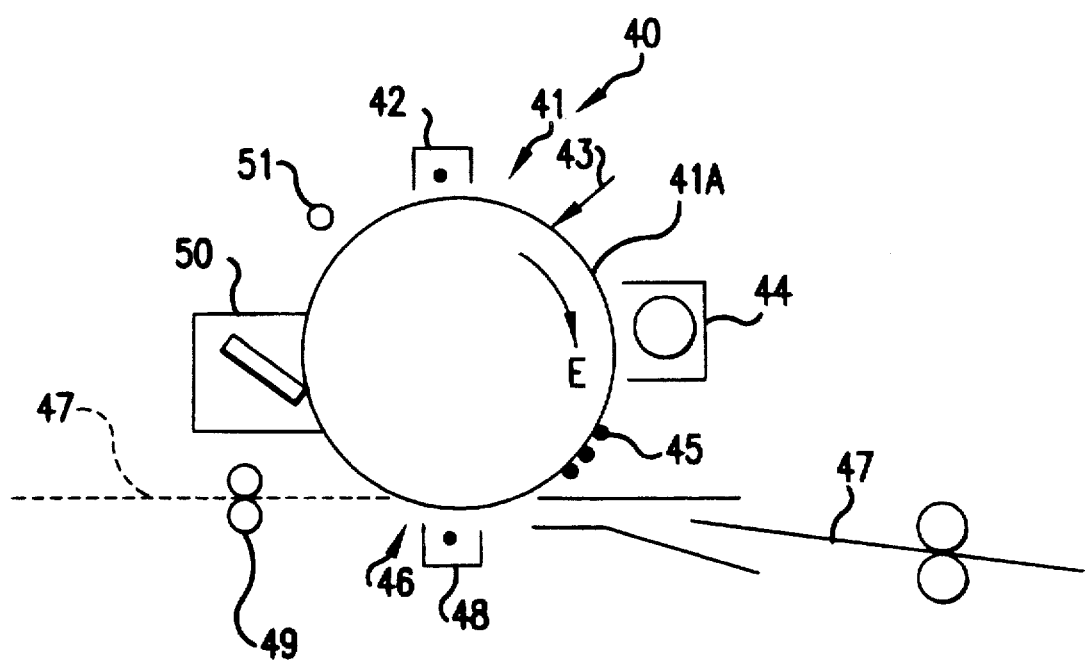
FIG. 15 is a diagrammatic side view of an image forming apparatus.

Referring to FIG. 15, an image forming apparatus 40 has a latent image recording unit 41 provided with a photoconductive drum 41A. An electrostatic latent image is formed on the circumference of the photoconductive drum 41A as the photoconductive drum 41A is rotated in the direction of the arrow E.

A primary charging corotron 42 charges the circumference of the photoconductive drum 41A uniformly, the charged circumference is irradiated with laser beam 43 modulated by an image signal. The potentials of points irradiated with the laser beam 43 change to form an electrostatic latent image. The electrostatic latent image is developed into a toner image 45 by a developing unit 44. The toner image 45 is transferred by the agency of a transfer corotron 48 to a recording sheet 47 fed to a predetermined transfer position 46 in synchronism with the rotation of the photoconductive drum 43. The toner image 45 transferred to the recording sheet 47 is fixed by, for example, heat and pressure to the recording sheet 47 by a fixing unit 49. Then, the recording sheet 47 carrying the fixed toner image 45 is sent out from the image forming apparatus 40.

Portions of the circumference of the photoconductive drum 41A passed the transfer position 46 is cleaned by a cleaning unit 50 to remove the residual toner and the circumference of the photoconductive drum 41A is irradiated with erasing light emitted by an erasing light source 51 to restore the circumference of the photoconductive drum 41A to the initial state. Then, the next image forming cycle is started. Some image forming apparatus are provided with a replaceable photoconductive drum cartridge including a photoconductive drum.

Figure 16:
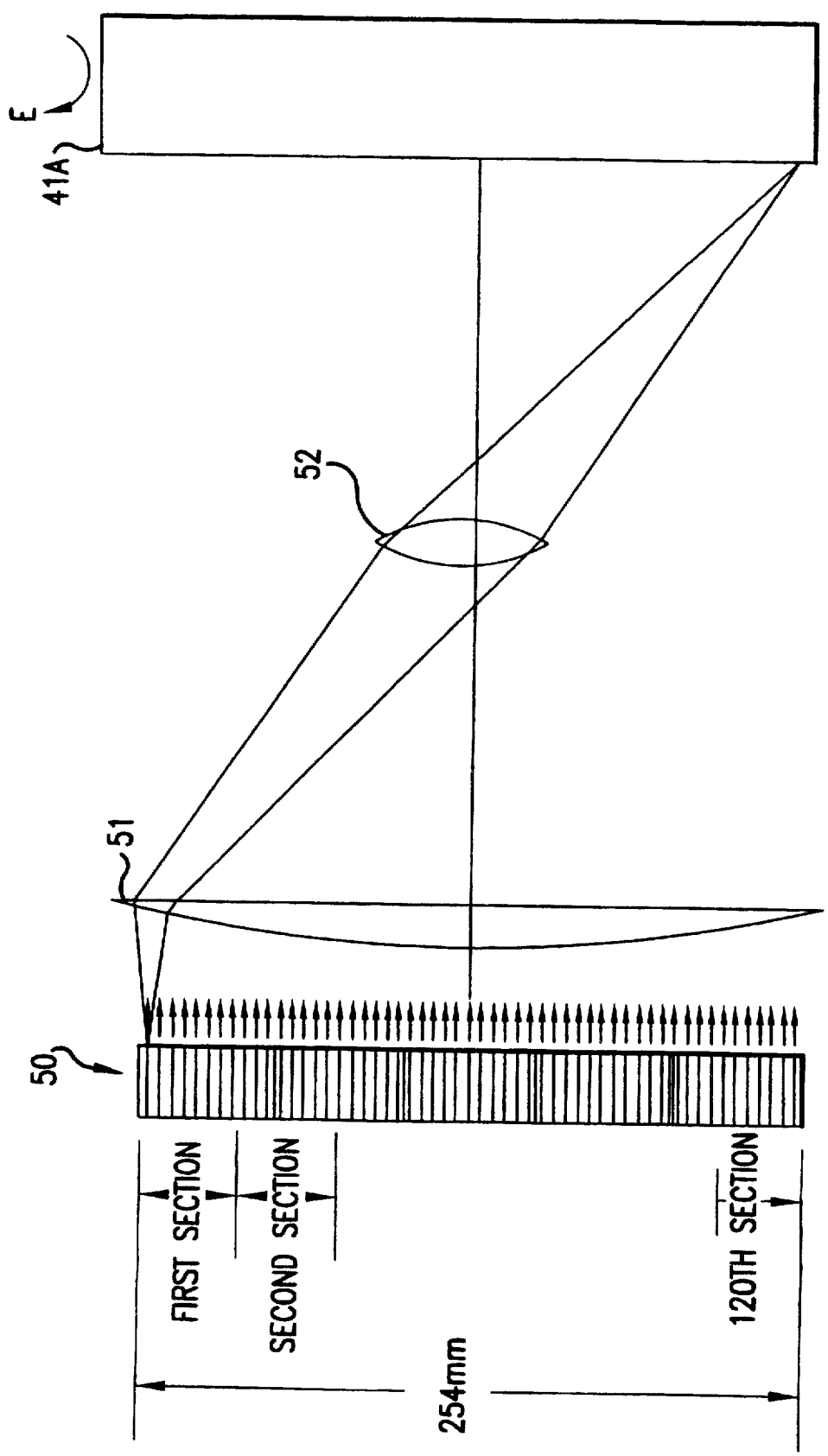
FIG. 16 is a diagrammatic view of an essential portion of an image forming apparatus embodying the present invention.

Referring to FIG. 16, the image forming apparatus of the present invention is provided with a semiconductor laser array 50 for irradiating the uniformly charged circumference of a photoconductive drum 41A with laser beam to form an electrostatic latent image on the photoconductive drum 41A. The semiconductor laser array 50 has 120 sections each having 100 laser elements and has a length of 254 mm. Therefore, the semiconductor laser array 50 has 12000 laser elements in total arranged at a pitch of about 21 μm.

The semiconductor laser array 50 is driven by, for example, the semiconductor laser array driving device of FIG. 13 to emit laser beam representing image information. The laser beam emitted by the semiconductor laser array 50 travels through two lenses 51 and 52 and falls on the circumference of the photoconductive drum 41A rotating in the direction of the arrow E to form an electrostatic latent image on the circumference of the photoconductive drum 41A.

Since this image forming apparatus does not need any scanning system including a mechanical scanning mechanism for scanning laser beam representing image information, the image forming apparatus is able to operate with improved reliability.

Although the present invention has been described as applied to an image forming apparatus that records an electrostatic latent image on the photoconductive drum 41A, the image forming apparatus may be designed so as to form a latent image on, for example, a photographic film.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A semiconductor laser array driving method for driving a semiconductor laser array having a plurality of light-emitting points arranged on a base member,
said semiconductor laser array driving method having a step of driving the plurality of light-emitting points by a driving pulse current of a pulse width and a duty factor meeting:

$\Delta T_1/\Delta T_0 < \frac{1}{2}$ where $\Delta T_0$ is a temperature rise in active layers of the light-emitting points when the semiconductor laser array is driven in a continuous drive mode using a continuous current, and $\Delta T_1$ is a temperature rise in the active layers of the light-emitting points when the semiconductor laser array is driven in a pulse drive mode using a pulse current.

2. A semiconductor laser array driving method according to claim 1, wherein the plurality of light-emitting points are driven by a driving pulse current having a duty factor of 0.4 or below meeting an inequality:

$y < 3.1 \exp(-8.9x)$ where x is a duty factor and y is a pulse width (μs).

3. A semiconductor laser array driving method for driving a semiconductor laser array having a plurality of light-emitting points arranged on a base member,
said semiconductor laser array driving method having a step of driving the plurality of light-emitting points by a driving pulse current of a pulse width and a duty factor meeting:

$\Delta T_1/\Delta T_0 < \frac{1}{2}$ where $\Delta T_0$ is a temperature rise in active layers of the light-emitting points when the semiconductor laser array is driven in a continuous drive mode using a continuous current, and $\Delta T_1$ is a temperature rise in the active layers of the light-emitting points when the semiconductor laser array is driven in a pulse drive mode using a pulse current.

4. A semiconductor laser array driving method according to claim 3, wherein the plurality of light-emitting points are driven by a driving pulse current having a duty factor of 0.1 or below meeting an inequality:

$y < 0.22 \exp(-6.4x)$ where x is a duty factor and y is a pulse width (μs).

5. A semiconductor laser array driving method according to claim 1, wherein the plurality of light-emitting points of the semiconductor laser array are driven by a driving pulse current having a pulse width and a duty factor meeting:

$\Delta T_1/\Delta T_0 < \frac{1}{2}$ and the light-emitting point groups, in each of which the number of the light-emitting points is the reciprocal of the duty factor, are driven by a driving pulse current so that the light-emitting points are driven sequentially for light emission.

6. A semiconductor laser array driving device for driving a semiconductor laser array having a plurality of light-emitting points arranged on a base member, said semiconductor laser array driving device comprising:
a signal input unit for providing a light-emitting point control signal specifying at least some light-emitting points to be driven for light emission among the plurality of light-emitting points; and a light-emitting point driving unit for driving the light-emitting points specified by the light-emitting point control signal among the plurality of light-emitting points by a driving pulse current of a pulse width and a duty factor meeting:

$$\Delta T_1/\Delta T_0 < \frac{1}{2}$$

where $\Delta T_0$ is a temperature rise in active layers of the light-emitting points when the semiconductor laser array is driven in a continuous drive mode using a continuous current, and $\Delta T_1$ is a temperature rise in the active layers of the light-emitting points when the semiconductor laser array is driven in a pulse drive mode using a pulse current.

7. A semiconductor laser array driving device according to claim 6, wherein the light-emitting point driving unit comprises:

a driver for driving the plurality of light-emitting points; and a light emission control circuit which gives the driver a signal indicating whether or not each of the plurality of light-emitting points is to be driven for light emission by the light-emitting point control signal provided by the signal input unit, according to the state of a pulse signal meeting:

$$y < 3.1 \exp(-8.9x)$$

where x is a duty factor, i.e., the ratio of a pulse width ($\mu$s) to a period at which the light-emitting points are examined sequentially and recurrently to see whether or not the light-emitting points are to be driven for light emission, and y is the pulse width ($\mu$s).

8. An image forming apparatus provided with a semiconductor laser array having a plurality of light-emitting points arranged on a base member and capable of carrying out image forming processes including at least a semiconductor laser array driving process, said image forming apparatus comprising:

a semiconductor laser array driving unit which receives an image signal indicating whether or not at least some of the plurality of light-emitting points are to be driven for light emission and which drives the light-emitting points specified by the image signal indicating the light-emitting points to be driven for light emission by a driving pulse current of a pulse width and a duty factor meeting:

$$\Delta T_1/\Delta T_0 < \frac{1}{2}$$

where $\Delta T_0$ is a temperature rise in active layers of the light-emitting points when the semiconductor laser array is driven in a continuous drive mode using a continuous current, and $\Delta T_1$ is a temperature rise in the active layers of the light-emitting points when the semiconductor laser array is driven in a pulse drive mode using a pulse current.

9. An image forming apparatus according to claim 8, further comprising a display screen for displaying an image formed by light emitted by the semiconductor laser array.

10. An image forming apparatus according to claim 8, further comprising a latent image recording unit fixedly or detachably provided with a latent image recording medium for recording a latent image represented by light emitted by the semiconductor laser array.

11. An image forming apparatus according to claim 8, wherein the plurality of light-emitting points of the semiconductor laser array are arranged at least along a scanning direction.

* * * * *